United States Patent
Daniels et al.

(10) Patent No.: US 9,478,700 B2
(45) Date of Patent: Oct. 25, 2016

(54) GROUP III-V/ZINC CHALCOGENIDE ALLOYED SEMICONDUCTOR QUANTUM DOTS

(71) Applicant: Nanoco Technologies, Ltd., Manchester (GB)

(72) Inventors: Steven Daniels, Derbyshire (GB); James Harris, Manchester (GB); Paul Glarvey, Cheshire (GB); Katherine Orchard, Royston (GB); Arun Narayanaswamy, Manchester (GB)

(73) Assignee: Nanoco Technologies Ltd., Manchester (GB)

( * ) Notice: Subject to any disclaimer, the term of this patent is extended or adjusted under 35 U.S.C. 154(b) by 299 days.

(21) Appl. No.: 14/209,603

(22) Filed: Mar. 13, 2014

(65) Prior Publication Data

US 2014/0264172 A1    Sep. 18, 2014

Related U.S. Application Data

(60) Provisional application No. 61/788,856, filed on Mar. 15, 2013.

(51) Int. Cl.
*H01L 33/06* (2010.01)
*C09K 11/70* (2006.01)
*C09K 11/02* (2006.01)

(52) U.S. Cl.
CPC ............... *H01L 33/06* (2013.01); *C09K 11/02* (2013.01); *C09K 11/703* (2013.01)

(58) Field of Classification Search
CPC ............................ C09K 11/703; H01L 33/506
See application file for complete search history.

(56) References Cited

U.S. PATENT DOCUMENTS 7,588,828 B2 * 9/2009 Mushtaq ............... C01B 25/082
                                                     427/212
2008/0160306 A1   7/2008 Mushtaq

FOREIGN PATENT DOCUMENTS

WO   2005-106082   11/2005
WO   2009-016354    2/2009

OTHER PUBLICATIONS

T. Kim et al.,Large-Scale Synthesis of InPZnS Alloy Quantum Dots with Dodecanethiol as a Composition Controller J. Phys. Chem. Lett., 2012, 3, 214.
L. Li & P. Reiss,One-pot Synthesis of Highly Luminescent InP/ZnS Nanocrystals without Precursor Injection J. Am. Chem. Soc., 2008, 130, 11588.
K. Huang et al.,Internal Structure of InP/ZnS Nanocrystals Unraveled by High-Resolution Soft X-ray Photoelectron Spectroscopy ACS Nano, 2010, 4, 4799.
U.T.D. Thuy et al., Luminescence properties of In (Zn)P alloy core/ZnS shell quantum dots Appl. Phys. Lett., 2010, 97, 193104.
J. Lim et al., InP@ZnSeS, Core@Composition Gradient Shell Quantum Dots with Enhanced Stability Chem. Mater., 2011, 23, 4459.
S. Xu et al., Rapid synthesis of highly luminescent InP and InP/ZnS nanocrystals J. Mater. Chem., 2008, 18, 2653.
S. Kim et al.,Highly Luminescent InP/GaP/ZnS Nanocrystals and Their Application to White Light-Emitting Diodes J. Am. Chem. Soc., 2012, 134, 3804.
Ung Thi Dieu Thuy et al: "Luminescence properties of In(Zn)P alloy core/ZnS shell quantum dots", Applied Physics Letters, vol. 97, No. 19, Jan. 1, 2010 (Jan. 1, 2010), p. 193104, XP055004346, ISSN: 0003-6951, DOI: 10.1063/1.3515417 figure 1 the whole document.
International Search Report PCT/IB2014/001045 dated Oct. 7, 2014.

* cited by examiner

*Primary Examiner* — Carol M Koslow
(74) *Attorney, Agent, or Firm* — Blank Rome LLP

(57) ABSTRACT

A scalable method for the manufacture of narrow, bright, monodisperse, photo-luminescent quantum dots prepared in the presence of a Group II-VI molecular seeding cluster fabricated in situ from a zinc salt and a thiol or selenol compound. Exemplary quantum dots have a core containing indium, phosphorus, zinc and either sulfur or selenium.

13 Claims, 4 Drawing Sheets

GROUP III-V/ZINC CHALCOGENIDE ALLOYED SEMICONDUCTOR QUANTUM DOTS

CROSS-REFERENCE TO RELATED APPLICATIONS

This application is a non-provisional of U.S. Provisional Application Ser. No. 61/788,856, filed Mar. 15, 2013, the entire contents of which are incorporated herein by reference.

BACKGROUND

1. Field of the Invention

This invention relates semiconductor nanoparticles. More particularly, it relates to the synthesis of photo-luminescent Group III-V quantum dots, such as InP, alloyed with zinc chalcogenides.

2. Description of the Related Art Including Information Disclosed Under 37 CFR 1.97 and 1.98.

Group III-V quantum dots (QDs), such as InP, are a favorable material for commercial applications as an alternative to heavy-metal-containing nanoparticles such as cadmium chalcogenides. Numerous methods to synthesize Group III-V core and Group III-V/ZnX (X=S, Se) core/shell quantum dots have been explored, including hot-injection and single-source precursor methods. Hot-injection involves the rapid injection of precursors at high temperature, triggering nanoparticle nucleation as the reaction temperature drops. This method is generally limited to producing small quantities of QDs because the time required to inject large volumes of precursors is too long for fast nucleation. Hot-injection methods on large scales typically result in an inhomogeneous particle size distribution.

Single-source precursor methods employ a molecular cluster compound containing all of the elements to be incorporated into the nanoparticle material, which decomposes at high temperature to initiate nanoparticle formation. One of the drawbacks of this method, however, is that the nanoparticle stoichiometry is inherently determined by the composition of the cluster compound. Other strategies to synthesize colloidal quantum dots include heating up precursors in solution, with the addition of other reagents during the course of the reaction.

In U.S. Pat. No. 7,588,828 (issued Sep. 15, 2009, the entire contents of which are incorporated herein by reference) entitled "Preparation of Nanoparticle Material," we disclosed a scalable "molecular seeding" method to synthesize Group III-V semiconductors using a Group II-VI molecular cluster as a template for nanoparticle growth. The molecular cluster could be formed prior to addition to the reaction flask, or formed from suitable reagents in situ. In one example, the zinc cluster, $[Zn_{10}S_4(S(C_6H_5))_{16}][NH(C_2H_5)_3]_4$, was used as a source of ZnS "seeds" to act as templates for the growth of InP nanoparticles.

A challenge in the synthesis of InP quantum dots is to achieve emission in the blue region of the visible spectrum. For the band gap of InP to be sufficiently large to emit blue light, a very small particle size is required. At this size, InP particles are intermediate between clusters and nanoparticles. As a result, the particles are highly unstable. Since the bulk band gap of ZnS is much wider than that of InP, by alloying ZnS into the InP cores their physical dimensions can be retained while blue-shifting their absorption and emission. Thus, strategies to increase the amount of Zn alloyed into the InP core are favorable for applications where enhanced blue light absorption and emission is of benefit, such as quantum dot light-emitting diodes.

Several examples of InP quantum dot synthesis without employing a molecular seeding cluster have been documented in the prior art. T. Kim et al. report the synthesis of InP—ZnS alloyed quantum dot cores using indium acetate, zinc acetate, dodecantheiol (DDT) and palmitic acid ($CH_3(CH_2)_{14}COOH$) in 1-octadecene as the non-coordinating reaction solvent [T. Kim et al., *J. Phys. Chem. Lett.*, 2012, 3, 214]. In a typical synthesis, $In(OAc)_3$, $Zn(OAc)_2$ and palmitic acid were mixed in a 1:3:3 molar ratio with DDT (0-3 molar equivalents) and 1-octadecene (ODE). After degassing, the mixture was heated to 210° C. A 1-mmol solution of $(TMS)_3P$ in ODE was added drop wise, at a rate of 1 mL·h$^{-1}$, over 5 hours. It was reported that the optical properties of the nanoparticles could be controlled by manipulating the relative ratio of DDT and palmitic acid surfactants added to the reaction flask. An increase in the quantity of DDT led to a blue-shift in $PL_{max}$, suggesting a higher ZnS content. All wavelengths emitted with a quantum yield<1%, which could be increased to between 20-45% by shelling with ZnS. Shelling was achieved by the addition of $Zn(OAc)_2$ to the solution of cores at room temperature, then heating at 230° C. for 5 hours, after which DDT was optionally added before further annealing for 2 hours (depending on the required $PL_{max}$). However, the resultant nanoparticles displayed poorly defined UV-visible absorption spectra, suggestive of broad particle size distributions.

Researchers at CEA, Grenoble, have reported a single-step procedure to synthesize InP/ZnS nanoparticles [L. Li & P. Reiss, *J. Am. Chem. Soc.*, 2008, 130, 11588]. 0.1 mmol of each of indium myristate $(In(MA)_x)$, zinc stearate, $(TMS)_3P$ and DDT were mixed with 8 mL of ODE at room temperature. The reagents were then heated to 230-300° C. at a rate of 2° C. s$^{-1}$ and held for a fixed time (between 5 minutes and 2 hours). By varying the reaction conditions, quantum yields in the range of 50-70% and FWHM values between 40-60 nm could be attained. When the amount of Zn and S precursors were reduced (In:P:MA:Zn:DDT=1:1:3.5:0.3:0.3), larger particles were synthesized with 68% quantum yield and a narrow size distribution, however the photo-stability was reduced with a $T_{50}$ (time after which the quantum yield falls to 50% of its original value) of 15 hours under UV irradiation. In a later publication, XPS analysis revealed that the particles grown by this procedure have a homogeneously alloyed InPZnS structure comprising In—P, $S_x$—In—$P_{1-x}$, and In—S components [K. Huang et al., *ACS Nano*, 2010, 4, 4799]. In a further publication [U. T. D. Thuy et al., *Appl. Phys. Lett.*, 2010, 97, 193104], the effect of zinc stearate concentration was studied. Increasing the amount of zinc in the reaction solution resulted in larger particles emitting at longer wavelengths.

A variation on the method described by Li and Reiss, without the addition of DDT, was used to synthesize InP cores that were subsequently shelled with a compositionally graded ZnSeS alloy [J. Lim et al., *Chem. Mater.*, 2011, 23, 4459]. Quantum yields in the region of 45% were achieved for the shelled nanoparticles.

The method disclosed by CEA, though a fairly rapid reaction producing reasonable quantum yields, has a number of disadvantages. Firstly, reaction temperatures up to 300° C. are required and the heating rate of 2° C.·s$^{-1}$ is unfeasible on a large scale, suggesting that the reaction would not be easily scalable. In addition, high quantum yield comes at the expense of stability.

Xu et al. report a rapid, single-step, single-pot method to synthesize InP and InP/ZnS nanoparticles with quantum yields in the region of 30% and 60%, respectively, exhibiting FWHM values around 60 nm [S. Xu et al., *J. Mater. Chem.*, 2008, 18, 2653]. In a typical synthesis, 0.1 mmol of $InCl_3$, 0.1 mmol of stearic acid, 0.1 mmol of zinc undecylenate, 0.2 mmol of hexadecylamine (HDA), and 3 mL of ODE or methyl myristate were mixed. The flask was purged with nitrogen and heated to 280° C. under vigorous stirring. 0.5 mL of a 0.2 mmol·$mL^{-1}$ solution of $(TMS)_3P$ in ODE was injected in quickly, then the solution was held at 240° C. for 20 minutes. The particle size could be manipulated by altering the concentrations of the zinc undecylenate and HDA. The PL could be tuned from 480-750 nm, but to achieve longer emission multiple injections were required. To shell the cores, the reaction solution was cooled to room temperature, then 0.15 mmol of zinc dithiocarbamate and 2 mL of ODE were added. After purging with nitrogen, the solution was heated to 230° C. for 20 minutes. The shelled nanoparticles were reported to display good stability against photo-bleaching. The method described by Xu et al. yields fairly bright nanoparticles with extensive wavelength tuneability, however the synthesis requires rapid injection, which is difficult to perform on a large scale.

In a variation of the method described by Xu et al., InP/GaP/ZnS quantum dots were synthesized by shelling a ZnInP core with GaP and ZnS [S. Kim et al., *J. Am. Chem. Soc.*, 2012, 134, 3804]. Different precursors were used, however, thiol was again eliminated from the core synthesis. In a typical reaction 0.12 mmol of $In(OAc)_3$, 0.06 mmol of $Zn(OAc)_2$, 0.36 mmol of palmitic acid and 8 mL of ODE were degassed at 110° C. for 2 hours. Under an inert atmosphere, the solution was heated to 300° C. and a solution of 0.06 mmol of $(TMS)_3P$ in 1 mL of ODE was injected in quickly. The reaction solution was then held at 230° C. for 2 hours, yielding cores with $PL_{max}$=530 nm. The cores were shelled with GaP and ZnS. The GaP layer was incorporated to mitigate the lattice mismatch between InP and ZnS. Cores emitting at 590 nm were also shelled with GaP and ZnS, causing the emission to shift to 615 nm with a quantum yield of 58%.

The method described by S. Kim et al. utilizes hot-injection of $(TMS)_3P$, which is difficult to replicate on a large scale. Further, their quantum yield for shelled red nanoparticles was quite low.

In summary, the methods described in the prior art fail to encompass all of the criteria to produce photo-luminescent Group III-V quantum dots on a large scale with optical properties that are suitable for commercial applications.

SUMMARY

Herein, we disclose a scalable method for synthesizing Group III-V/ZnX (X=chalcogen) quantum dots (QDs) wherein zinc acetate and a thiol or selenol [R—Se—H] compound react in situ to form ZnS- or ZnSe-based "molecular seeds," which act as templates for growth of the Group III-V semiconductor core. The emission wavelength of the resultant nanoparticles can be tuned across the entire visible spectrum. The disclosed method of zinc and chalcogen addition to the reaction solution results in a certain degree of alloying of ZnX (X=chalcogen) into the core, leading to a larger nanoparticle size relative to pure InP core quantum dots, while maintaining a comparable emission profile of the smaller cores. This increase in particle size allows a narrower full-width at half-maximum (FWHM) of the photoluminescence peak and improves nanoparticle stability. More specifically, the QDs exhibit resistance to agglomeration and oxidation, particularly in the case of small (i.e. blue or green-emitting) quantum dots.

In a further embodiment, we show that a combination of the ZnS cluster with an additional zinc salt and thiol can be used to grow cores that are blue-shifted relative to those made with cluster alone. The alloyed nature of the core may be favorable for increasing the absorption in the blue region of the electromagnetic spectrum, which may be advantageous for technological applications.

The synthesis described herein uses much lower molar ratios of zinc and thiol to indium than prior art methods, achieving UV-visible absorption profiles with greater definition and significantly higher quantum yields post-etching and shelling (i.e., the growing of one or more layers of additional semiconductor materials upon the surface of the core). The reaction solution according to the presently disclosed methods is significantly more concentrated than those described in the prior art, facilitating development of the reaction to a commercial scale. So, for example, the presently disclosed method has a number of advantages compared to the reaction procedure described by T. Kim et al. mentioned in the Background section. Firstly, the maximum reaction yield in the Kim method was less than 3 g in a single reaction. According to the present method, the reaction solution is significantly more concentrated, allowing reaction yields in the region of 10 g inorganic content to be obtained using common lab-bench equipment. Moreover, the reaction is scalable, i.e., greater yields are possible with preparative-scale equipment. In addition, the cores described herein display quantum yields in the region of 3-4%, which have been demonstrated to increase to >80% (see, for example, Example 3) with the growth of a ZnS shell, which is approximately four times that for red quantum dots emitting at a similar wavelength reported by Kim et al. The presently disclosed product yields and quantum yields are also significantly higher than those obtained using the CEA method.

DESCRIPTION

Figure 1:
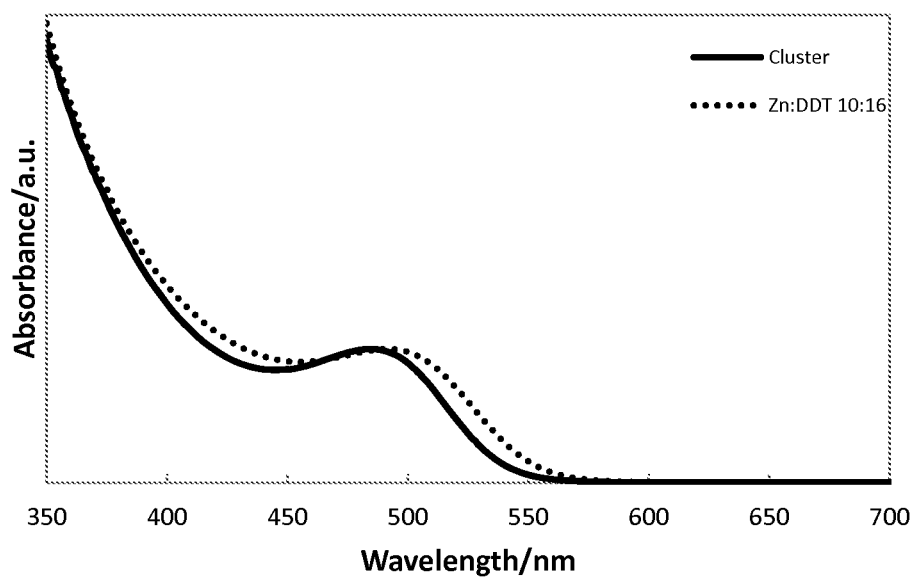
FIG. 1 contains UV-visible absorption spectra of cores synthesized with a cluster (solid line) and without a cluster using Zn:DDT in a molar ratio of 10:16 (Example 1, dotted line). The UV-visible $abs_{max}$ are well-defined in both cases, indicating narrow particle size distributions, with $abs_{max}$ being red-shifted in the absence of cluster (492 nm, compared to 485 nm when using the cluster).

Applicant's U.S. Pat. No. 7,588,828, issued Sep. 15, 2009, the entire contents of which are incorporated herein by reference, describes using a Zn and S molecular cluster compound, such as [Zn$_{10}$S$_4$(S(C$_6$H$_5$))$_{16}$][NH(C$_2$H$_5$)$_3$]$_4$, as a molecular template for seeding the synthesis of III-V semiconductor quantum dots (QDs) such as InP. The molecular cluster compound can be synthesized ahead of time and added to the QD core synthesis, or alternatively, can be formed in situ. The methods described herein involve preparing QDs having III-V-based semiconductor cores, in the presence of zinc and chalcogens, wherein the zinc and chalcogens serve to (1) form a molecular cluster in situ as a molecular template for seeding the synthesis of the QD core, and (2) provide a source of zinc and chalcogen that are incorporated into the QD core, yielding an alloyed semiconductor. As used herein, the terms quantum dots, QDs, nanoparticles, and nanocrystals are used interchangeably.

In various embodiments, the formation of the QDs from the QD material precursors is carried out under conditions to ensure that, either there is direct reaction and growth between the precursor composition and the molecular cluster, or some QDs grow at the expense of others (due to Ostwald ripening) until reaching a certain size at which there is direct growth of the nanoparticle from the precursors. Such conditions ensure that the monodispersity of the cluster compound is maintained throughout nanoparticle growth, which in turn ensures that a monodisperse population of nanoparticles is obtained.

Various embodiments concern the conversion of a nanoparticle precursor composition to a desired nanoparticle. Suitable precursors include single-source precursors, which comprise the two or more ions to be incorporated into the growing nanoparticle (for example In and P), or multi-source precursors in which two or more separate precursors each contain at least one ion to be included in the growing nanoparticle. As used herein, the term "nanoparticle precursor" refers to the sources of the group III group V ions that are incorporated into the QD core. For example, the source of the group III ions of the QD core is referred to as the group III precursor and the source of the V ions of the QD core is referred to as the group V precursor. Also, as used herein, the term "cluster precursors" refers to the sources of Zn and chalcogen that form the molecular cluster compound in situ. As noted above, Zn and chalcogen is also incorporated into the growing QD, in addition to reacting to form the molecular cluster compound. That notwithstanding, the Zn and chalcogen sources are referred to as cluster precursors, i.e., Zn precursors and chalcogen precursors, respectively.

The total amount of precursor composition required to form the final desired yield of nanoparticles may be added before nanoparticle growth has begun; alternatively, the precursor(s) may be added in stages throughout the reaction.

The conversion of the precursor(s) into nanoparticles may be conducted in a suitable solvent. When the cluster precursors and nanoparticle precursor(s) are introduced into the solvent, the temperature of the solvent is preferably sufficiently high to ensure satisfactory dissolution and mixing of the cluster compound. Full dissolution is preferable but not necessary. Exemplary solvent temperatures high enough to promote dissolution of the cluster compound yet low enough to maintain cluster compound integrity may be within the range of approximately 25° C. to approximately 100° C. Once the cluster precursors and nanoparticle precursors are sufficiently well dissolved in the solvent, the temperature of the solution thus formed is raised to a temperature, or to a range of temperatures, which is/are sufficiently high to initiate nanoparticle growth but not so high as to damage the integrity of the cluster compound molecules forming in situ. For example, the growth initiation temperature may be within the range of approximately 100° C. to approximately 350° C. According to certain embodiments, the temperature can be 100° C. to 300° C., 100° C. to 250° C., or 100° C. to 200° C. As the temperature is increased, further quantities of the precursors may be added to the reaction in a drop-wise manner (i.e., in liquid form) or as a solid. The temperature of the solution may then be maintained at the formation temperature (or within the formation temperature range) for as long as required to form nanoparticles possessing the desired properties. The reaction times can be on the order of a few hours to a few days. In some instances the reaction time is maintained for at least 24 hours.

A wide range of appropriate solvents is available. Typical solvents include Lewis base-type coordinating solvents, such as a phosphine (e.g., tri-n-octylphosphine (TOP)), a phosphine oxide (e.g., tri-n-octylphosphine oxide (TOPO)), an amine (e.g., hexadecylamine (HDA)), or a non-coordinating organic solvent, e.g. an alkane or an alkene. A particularly useful non-coordinating solvent is a hydrogenated terphenyl such as Therminol 66™ (Solutia Inc. St. Louis Mo. 63141), which is commonly used as a heat transfer fluid.

If a non-coordinating solvent is used, it will usually be in the presence of an additional coordinating agent to act as a capping agent. The reason is that capping of nanoparticle surface atoms which are not fully coordinated, i.e., have dangling bonds, serves to minimize non-radiative electron-hole recombination and inhibit particle agglomeration (which can lower quantum efficiencies). A number of different coordinating solvents may also act as capping or passivating agents, e.g. TOP, TOPO, organo-thiols, long-chain organic acids such as myristic acid, long chain amines, or functionalized PEG chains. If a solvent is used which does not act as a capping agent, then any desirable capping agent may be added to the reaction mixture during nanoparticle growth. Such capping agents are typically Lewis bases, but a wide range of other agents are available, such as oleic acid or organic polymers which form protective sheaths around the nanoparticles.

The progress of nanoparticle growth can be monitored in any convenient way, such as photoluminescence (PL) or UV-visible (UV-vis) spectroscopy. Once nanoparticles have been produced having the desired properties, e.g., when a nanoparticle peak is observed on the PL/UV-vis emission spectra at the desired wavelength, further growth may be inhibited by altering the reaction conditions, e.g. reducing the temperature of the solution below that necessary to support nanoparticle growth. At this stage, the nanoparticles can be isolated from the growth solution by any convenient means, such as precipitation, or allowed to anneal at a suitable temperature for any desirable amount of time, e.g., 10 minutes to 72 hours, to "size-focus" via Ostwald ripening prior to isolation. Following initial isolation, the nanoparticle material may then be subject to one or more rounds of washing to provide final nanoparticles of high purity.

The QD cores described herein are III-V (i.e., 13-15) semiconductor materials, which include a first element from group 13 of the periodic table and a second element from group 15 of the periodic table, including but not limited to boron phosphide (BP), aluminum phosphide (AlP), aluminum arsenide (AlAs), aluminum antimonide (AlSb), gallium nitride (GaN), GaP, gallium arsenide (GaAs), gallium antimonide (GaSb), indium nitride (InN), InP, indium arsenide (InAs), indium antimonide (InSb), aluminum nitride (AlN), boron nitride (BN), and/or ternary, quaternary, or higher alloys of these materials.

Sources of the group III elements B, Al, Ga, or In include: III-phosphines (i.e., at least one group III element coordinated to a phosphine), III-$(TMS)_3$, III-(alkyls) (e.g., trimethyl indium), III-(aryl), III-(acetate)$_3$ (e.g., III-(myrisate)$_3$), mixed alkyl- and aryl-acetates (e.g., III-(myrisate)(acetate)$_2$ or III-(myrisate)$_2$(acetate)), III-(III) acetylacetonate; organometallics such as $MR_3$ (M=Ga, In, Al, B; R=alkyl or aryl group such as Me, Et, $^i$Pr); coordination compounds such as carbonates, such as $M_2(CO_3)_3$ (M=B, Al, Ga, In); .beta.-diketonates or derivatives thereof, such as acetylacetonate (2,4-pentanedionate); $[CH_3COCH=C(O-)CH_3]_3M$, (M=B, Al, Ga, In); inorganic salts such as oxides or nitrides, such as: $In_2O_3$; $Ga_2O_3$; $Al(NO_3)_3$; $In(NO_3)_3$; $Ga(NO_3)_3$; or elemental B, Al, Ga, and/or In.

Sources of the group V elements N, P, As, Sb, or Bi include: organometallics, in which R=Me, Et, $^t$Bu, $^i$Bu, Pr$^j$, Ph, or similar groups, such as: $NR_3$, $PR_3$, $AsR_3$, $SbR_3$; $NHR_2$, $PHR_2$, $AsHR_2$, $SbHR_2$; $NH_2R$, $PH_2R$, $AsH_2R_2$, $SbH_2R_3$; $PH_3$, $AsH_3$; M(NMe)3 (M=P, Sb, As; dimethyldrazine ($Me_2NNH_2$)); ethylazide (Et-NNN); hydrazine ($H_2NNH_2$); $Me_3SiN_3$; coordination compound such as carbonates, such as $MCO_3$ (M=P) or bismuth subcarbonate (($BiO)_2CO_3$); .beta.-diketonates or derivatives thereof, such as acetylacetonate (2,4-pentanedionate); $[CH_3COCH=C(O-)CH_3]_2M$ (M=Bi); $[CH_3COCH=C(O-)CH_3]_2M$ (M=Bi); inorganic salts such as oxides or nitrates, such as: $P_2O_3$; $As_2O_3$; $Sb_2O_3$; $Sb_2O_4$; $Sb_2O_5$; $Bi_2O_3$; $Bi(NO_3)_3$; $Sn(NO_3)_4$; $Pb(NO_3)_2$; or elemental N, P, As, Sb, and/or Bi.

Various precursors can be utilized as sources for one or more of the elemental species desired in one or more shells formed around the core of the final nanoparticle. For a shell of composition ME (which includes the elements M and E), a source for element M may be further added to the reaction and may include an M-containing species that has the ability to provide the growing particles with a source of M ions. Likewise, a source for element E may be further added to the reaction and may include an E-containing species that has the ability to provide the growing particles with a source of E ions. The precursor may be an organometallic compound, an inorganic salt, a coordination compound, or an elemental source.

Returning again to the molecular cluster precursors, the ratio of zinc to chalcogen can be varied. According to one embodiment the ratio can be equivalent molar ratios of zinc to thiol as found in the cluster compound $[Zn_{10}S_4(S(C_6H_5))_{16}][NH(C_2H_5)_3]_4$, (without the additional $S_4$ and $NHEt_3$ provided by the cluster), i.e. a Zn:thiol molar ratio of 10:16. The effect of varying Zn:S ratios are described in the Examples below.

EXAMPLES

Example 1

Synthesis of Red Photo-Luminescent InPZnS Cores Using Zinc Acetate and DDT (10:16 Molar Ratio)

1.5 g (2.64 mmol) of indium myristate, 0.14 g (0.61 mmol) of myristic acid, and 12 mL of Therminol 66™ (Solutia Inc. St. Louis Mo. 63141) were degassed at 100° C. for 1 hour in a round-bottomed flask fitted with a magnetic stirrer and condenser. The flask was back-filled with nitrogen, then 0.20 g (1.10 mmol) of anhydrous zinc acetate were added, and the mixture was degassed for a further 1 h at 100° C. The flask was flushed with nitrogen three times and 0.42 mL (1.76 mmol) of 1-dodecanethiol (DDT) were added. Tris(trimethylsilyl)phosphine (($TMS)_3P$) solution (0.54 mL of 1 M $(TMS)_3P$ in a 70:30 mixture of diphenyl ether: Therminol 66™) was added at 100° C., at a rate of 1.00 mL·h$^{-1}$. The temperature was raised to 160° C. and $(TMS)_3P$ solution (0.72 mL, 0.72 mmol) was added at a rate of 1.45 mL·h$^{-1}$. The temperature was raised to 210° C. and $(TMS)_3P$ (0.96 mL, 0.96 mmol) was added at a rate of 1.45 mL·h$^{-1}$. The temperature was raised to 230° C. and the mixture held at this temperature for 3 days.

For comparison, the core synthesis was repeated using the same conditions but using a pre-prepared $[Zn_{10}S_4(S(C_6H_5))_{16}][NH(C_2H_5)_3]_4$ molecular cluster compound as described in U.S. Pat. No. 7,588,828 instead of using a cluster obtained in situ using zinc acetate and DDT. The UV-visible absorption spectrum of QDs prepared using the pre-prepared cluster (see FIG. 1, solid line) exhibits a well-defined peak at 485 nm, which is slightly blue-shifted in comparison to that of cores synthesized using the same method but using zinc acetate and DDT (abs$_{max}$=492 nm, dotted line). This suggests that the particles synthesized without a cluster are slightly larger in diameter, while the narrow particle size distribution is maintained.

Example 2

Figure 2:
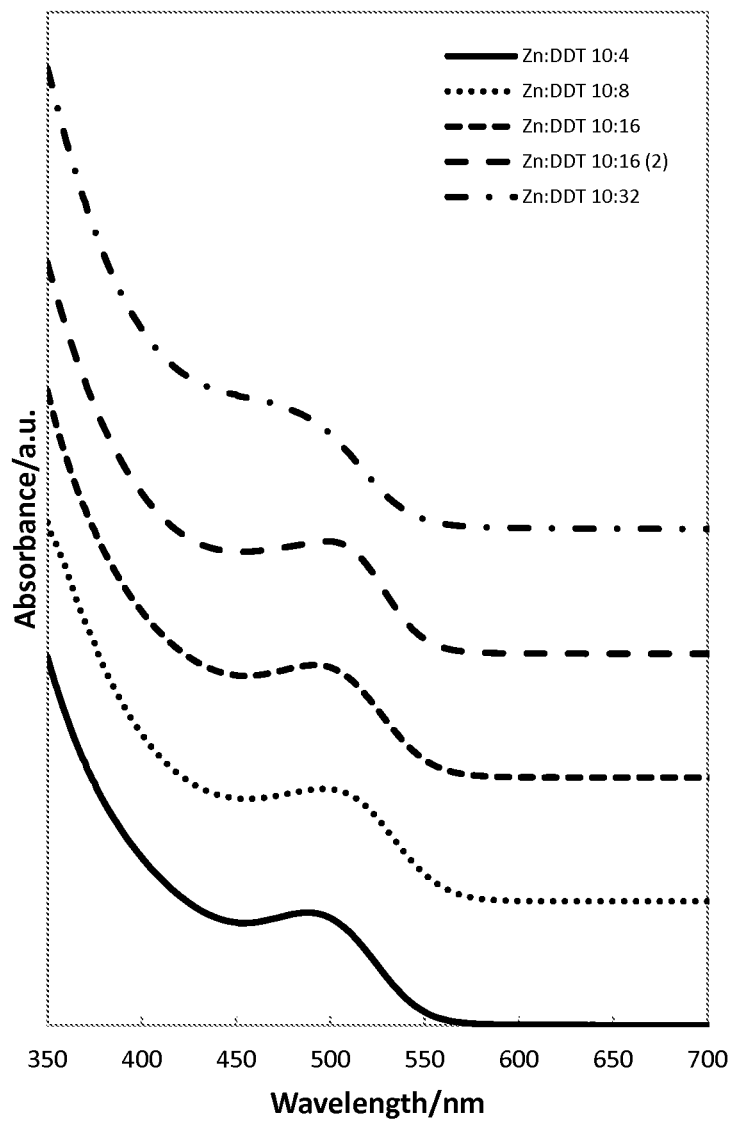
FIG. 2 shows comparative UV-visible absorption spectra with variation in the Zn:DDT ratio. Ratios between 10:4 and 10:16 show similar $abs_{max}$ and peak definition. Doubling the thiol content relative to that in the cluster compound resulted in a significant blue-shift (~25-30 nm) and loss of peak definition, indicative of a broadening of the particle size distribution.

Synthesis of Red Photo-Luminescent InPZnS Cores Using Zinc Acetate and DDT in Varying Molar Ratios The synthetic procedure in described in Example 1 was repeated with varying zinc acetate-to-DDT ratios. The results are summarized in Table 1. Little variation was observed in the UV-visible absorption spectra (see FIG. 2) for Zn:DDT ratios between 10:4 and 10:16. When the DDT was increased to a Zn:DDT ratio of 10:32, a significant blue-shift of 25-30 nm was observed, along with loss of definition of the absorption peak, indicative of broadening of the particle size distribution.

The results suggest that the particle size and uniformity are maintained while significantly reducing the amount of thiol relative to that present in the molecular seeding cluster.

TABLE 1

UV-visible absorption data for InP cores grown
with varying ratios of zinc acetate to DDT.

| Zn:DDT Ratio | Zn(OAc)$_2$/mmol | DDT/mmol | UV-visible Abs$_{max}$/nm | Peak Profile |
|---|---|---|---|---|
| 10:4 | 1.1 | 0.44 | 488 | Defined |
| 10:8 | 1.1 | 0.88 | 497 | Defined |
| 10:16 | 1.1 | 1.76 | 492 | Defined |
| 10:16 | 1.1 | 1.76 | 498 | Defined |
| 10:32 | 1.1 | 3.52 | 466 | Broad |

Example 3

Synthesis of Red Photo-Luminescent InPZnS/ZnS Core/Shell Quantum Dots Using Zinc Acetate and Thiophenol (10:16 Molar Ratio)

Figure 3:
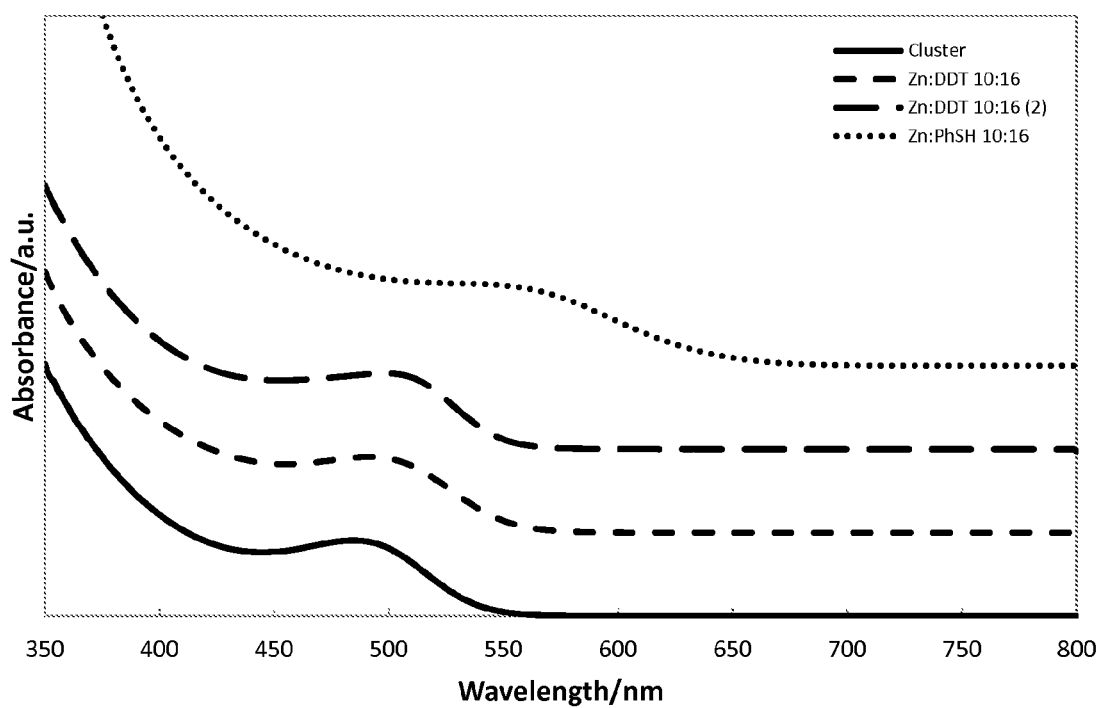
FIG. 3 contains UV-visible absorption spectra comparing InPZnS cores synthesized with equivalent Zn:thiol ratios using cluster (solid line), zinc acetate and DDT (dashed lines), and zinc acetate and thiophenol (dotted line). Using thiophenol (as described in Example 3, infra) resulted in a marked red-shift, along with loss of definition of the absorption peak, indicative of broadening of the particle size distribution.

The process in Example 1 was repeated, except 1.76 mmol (0.18 mL) of thiophenol was substituted for the DDT of Example 1. The UV-visible absorption spectrum (FIG. 3) shows a broad peak at ~563 nm, which is red-shifted in comparison to that of cores synthesized using either the same method but with DDT, or synthesized with a zinc cluster. This suggests that the particles synthesized with thiophenol are significantly larger than those synthesized with the equivalent thiol in the zinc cluster [Zn$_{10}$S$_4$(SC$_6$H$_5$))$_{16}$][NH(C$_2$H$_5$)$_3$]$_4$ or alkanethiol. Thiophenol also results in broadening of the particle size distribution.

The optical characteristics of the quantum dots were enhanced by first treating the nanoparticles with an acid etch (PL$_{max}$=617 nm, FWHM=50 nm), then growing a ZnS shell epitaxially on the core surface to enhance stability. After collecting the etched nanoparticles by centrifugation, a 125 mg inorganic content (IC) sample in chloroform (21.9 mg IC·mL$^{-1}$) was mixed with zinc acetate (1.43 g, 4.90 mmol), zinc stearate (0.80 g, 1.27 mmol), and Therminol 66™ (12 mL). The mixture was degassed under vacuum at 100° C. for 1 hour. The reaction was flushed with N$_2$, heated to 250° C., and held for 10 minutes. The mixture was cooled to 230° C., then DDT (1.7 mL, 7.1 mmol) was added, and the solution was held for 1 hour. The temperature was reduced to 200° C., then 1-octanol (0.3 mL, 1.9 mmol) was added, and the temperature was held for 30 minutes. After cooling, isolation was carried out in aerobic conditions. The nanoparticles were precipitated with acetone and collected by centrifugation. The solid was re-dispersed several times in toluene and re-precipitated with MeOH/IPA, followed by centrifugation, then the solid was finally dissolved in toluene. The resulting quantum dots had PL$_{max}$=618 nm, FWHM=66 nm, and the quantum yield (QY)=84%.

Example 4

Synthesis of Red Photo-Luminescent InPZnSe Cores Using Zinc Acetate and Octane Selenol (10:16 Molar Ratio)

Figure 4:
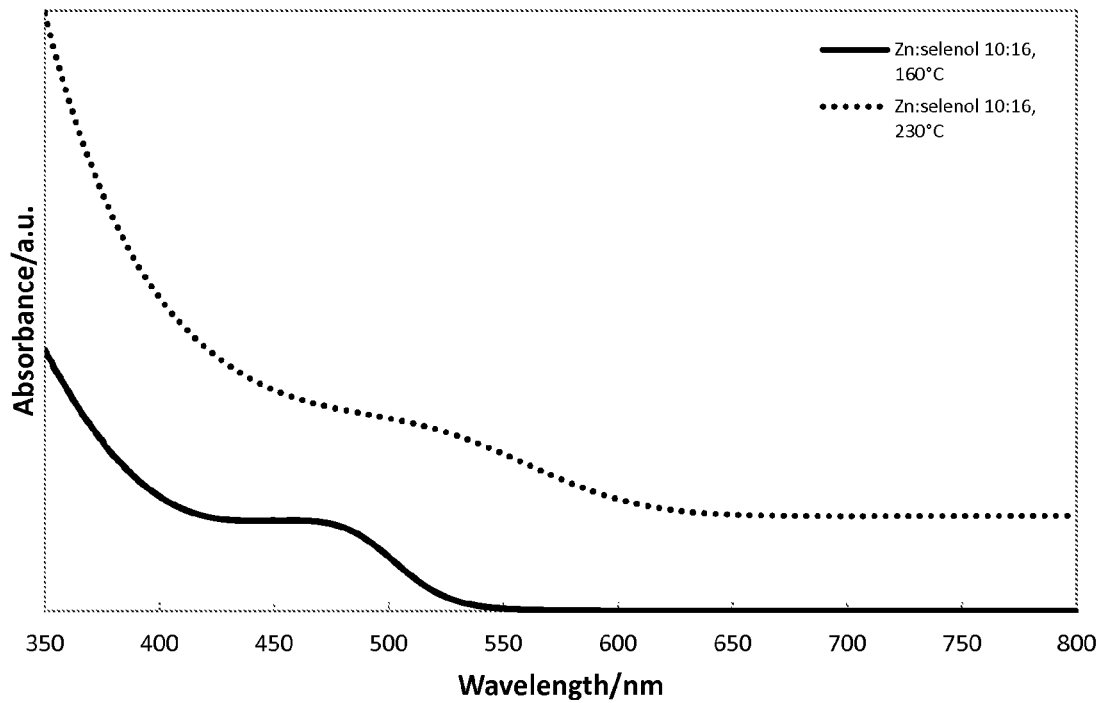
FIG. 4 shows UV-visible absorption spectra of InPZnSe cores synthesized with zinc acetate and 1-octane selenol (10:16 molar ratio, prepared as described in Example 4, infra). Annealing for three days at 230° C. resulted in a broad absorption shoulder around 523 nm, whereas lowering the annealing temperature to 160° C. (with (TMS)$_3$P additions at 100° C., 120° C. and 140° C.) resulted in a significant blue-shift in abs$_{max}$ to ~477 nm, with better peak definition.

The synthesis described in Example 1 was repeated, substituting DDT for 1.76 mmol (0.31 mL) of 1-octane selenol. The procedure resulted in the growth of nanoparticles with a broad UV-visible absorption spectrum with abs$_{max}$ at around 523 nm, i.e. red-shifted by approximately 25-30 nm relative to cores grown with DDT, as shown in FIG. 4.

The procedure was then repeated with 1-octane selenol but lowering the (TMS)$_3$P addition temperatures to 100° C., 120° C. and 140° C. (rather than 100° C., 160° C. and 210° C.), and annealing for three days at 160° C. (rather than 230° C.). The lower annealing temperatures resulted in a significant relative blue-shift in the UV-visible abs$_{max}$ (~477 nm, FIG. 4) and better peak definition suggestive of a relatively narrow particle size distribution.

Example 5

Synthesis of Green Photo-Luminescent InPZnS Cores Using ZnS Cluster with Additional Zn Salts and Dodecanethiol Green InPZnS alloyed cores were synthesized using a combination of ZnS cluster and additional Zn salts and DDT. 5.87 g (22.32 mmol) of indium myristate, 0.76 g (3.29 mmol) of myristic acid, 1.265 g (2.00 mmol) of zinc stearate, and 50 mL of Therminol 66™ were degassed at 100° C. for 2 hours in a round-bottomed flask fitted with a magnetic stirrer and condenser. The flask was back-filled with nitrogen, then 1.35 g (0.495 mmol) of the zinc cluster, [Zn$_{10}$S$_4$(S(C$_6$H$_5$))$_{16}$][NH(C$_2$H$_5$)$_3$]$_4$, followed by 0.48 mL (2.00 mmol) of 1-dodecanethiol (DDT), were added to the flask and the solution was degassed for a further 30 minutes. The flask was back-filled with nitrogen, then tris(trimethylsilyl) phosphine ((TMS)$_3$P) solution (2.25 mL of 1 M (TMS)$_3$P in a 70:30 mixture of diphenyl ether:Therminol 66™) was added at 100° C., at a rate of 3.6 mL·h$^{-1}$. The temperature was raised to 160° C. and (TMS)$_3$P solution (3 mL, 3 mmol) was added at a rate of 3.6 mL·h$^{-1}$. The temperature was raised to 195° C. and (TMS)$_3$P (4 mL, 4 mmol) was added at a rate of 3.6 mL·h$^{-1}$. Once the addition was complete, the solution was annealed at 195° C. for 6 days.

Figure 5:
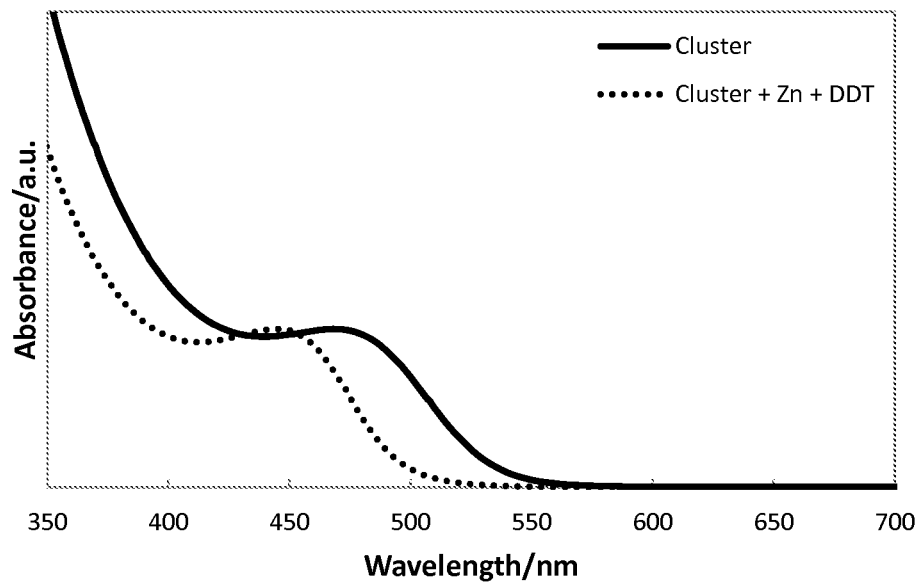
FIG. 5 contains UV-visible absorption spectra (solid line) of cores synthesized with cluster and using the method outlined in Example 5, using cluster with additional zinc stearate and DDT (dotted line). The UV-visible absorption maximum is better-defined when zinc stearate and DDT are added to the reaction, indicating narrow particle size distributions, with abs$_{max}$ being blue-shifted (444 nm, compared to 468 nm) when using the cluster alone.

The UV-visible absorption spectrum (see FIG. 5) exhibits a well-defined peak at 444 nm, which is slightly red-shifted in comparison to that of cores synthesized using the same method but without the zinc stearate and DDT (abs$_{max}$~460-470 nm). This suggests that the particles synthesized with a combination of a cluster, zinc salts and thiol contain a larger amount of alloyed ZnS, increasing the absorption band gap and thus blue-shifting the absorption.

Example 6

Stability Testing

Figure 6:
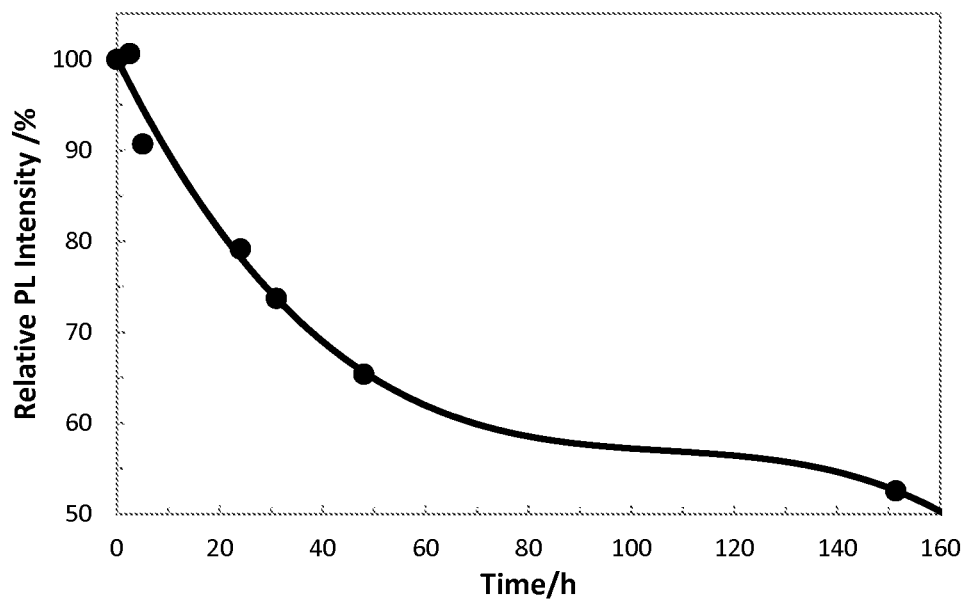
FIG. 6 is a plot of the relative photo-luminescence intensity versus time under continuous UV (365 nm) excitation for InPZnS/ZnS alloyed core/shell quantum dots (prepared as described in Example 3) in toluene. The T$_{50}$ is estimated to occur at 160 h.

A toluene solution of the InPZnS/ZnS core/shell nanoparticles synthesized in Example 3 was held under continuous irradiation using a UV lamp emitting at 365 nm, in air. Aliquots were taken periodically to measure the optical characteristics. After over 150 hours, the quantum yield remained above 50% of its initial value, as shown in FIG. 6. The PL$_{max}$ and FWHM also showed a high level of stability, red-shifting by 3 nm and broadening by 1 nm, respectively, during this time interval. Using a third order polynomial fit (R$^2$=0.986), T$_{50}$ (the time at which the relative PL intensity falls to 50% of its initial value) was predicted to be 160 h.

Example 7

Elemental Analysis

Quantification of the Level of Alloying

The amount of Zn and S incorporated into the cores was measured by inductively coupled plasma (ICP) elemental analysis. The results were normalized to the number of moles of In (assuming 100% of the In added to the reaction solution was incorporated into the cores), then expressed as a percentage of the number of moles of reagent added. The results are summarized in Table 2. It can be seen that the relative amount of Zn alloyed into the cores is significantly higher using the present method than using the pre-fabricated cluster, even when the In:Zn precursor ratio was reduced by half relative to the cluster method. Using $Zn(OAc)_2$ and DDT, there appears to be a degree of correlation between the Zn:thiol ratio and the level of Zn incorporated into the cores—the higher the level of thiol, the higher the level of Zn alloying. However, once the Zn:DDT ratio falls to 10:4 or below, the level of Zn remains at approximately 80% of its theoretical maximum. The higher the level of thiol added to the reaction solution, the lower the percentage of this that is incorporated as sulfur into the cores. This would suggest that there is a limit to the level of S that can be alloyed into the cores, but that excess thiol plays an important role in the mechanism of alloying Zn into the cores.

TABLE 2

Comparison of the number of moles of Zn and S incorporated into the cores, relative to the number of moles of Zn and thiol precursors added to the reaction solution (normalized to 100% In incorporation).

| Zn:Thiol | Predicted | | | Measured | | | | |
|---|---|---|---|---|---|---|---|---|
| | In | Zn | S | In | Zn | S | % Zn | % S |
| 10:16 | 2.64 | 1.10 | 2.21 | 2.64 | 0.78 | 1.44 | 71 | 64 |
| (Cluster) | 2.64 | 1.10 | 2.21 | 2.64 | 0.78 | 1.40 | | |
| 10:32 | 2.64 | 1.10 | 3.52 | 2.64 | 1.11 | 1.88 | 101 | 53 |
| | 2.64 | 1.10 | 3.52 | 2.64 | 1.11 | 1.83 | | |
| 10:4 | 2.64 | 1.10 | 0.44 | 2.64 | 0.88 | 0.38 | 80 | 86 |
| 10:2 | 2.64 | 1.10 | 0.21 | 2.64 | 0.92 | 0.25 | 84 | 119 |
| 10:0 | 2.64 | 1.10 | 0.00 | 2.64 | 0.91 | 0.02 | 83 | — |
| 10:16 | 2.64 | 0.55 | 0.88 | 2.64 | 0.52 | 0.59 | 95 | 67 |

Using the present method, InP cores are synthesized by in situ formation of the molecular seeding cluster, thus avoiding the need to prefabricate the cluster compound, which in turn reduces the time and cost associated with the synthesis. Furthermore, experimentation has shown that the number of moles of thiol can be significantly reduced with respect to that in the cluster compound $[Zn_{10}S_4(S(C_6H_5))_{16}][NH(C_2H_5)_3]_4$, while preserving the narrow particle size distribution. Reducing the amount of thiol added to the reaction solution can further reduce the cost. Inductively coupled plasma (ICP) elemental analysis suggests higher % Zn incorporation, i.e. higher Zn alloying efficiency, for batches made without cluster, even when the amount of thiol precursor is significantly reduced. As such, using the current procedure it may be possible to grow larger particles with fewer growth steps, simplifying the synthesis. Using a combination of ZnS cluster with a zinc salt and thiol, the benefits of alloying wider band gap zinc sulfide into the cores (e.g., blue-shifted absorption and emission while maintaining the nanoparticle size relative to InP) are enhanced using the present invention.

Using the method described herein, following post-synthetic etching and shelling treatments, quantum yields of about 80% have been demonstrated. This is significantly higher than values reported in the prior art using single-pot methods. Although the present synthesis employs substantially longer annealing times, the resultant nanoparticles demonstrate high-uniformity and good long-term stability ($T_{50}$~160 h), traits that are advantageous for technological applications such as QD light-emitting diodes and QD phosphors.

One particular advantage of the present method is that the reaction encompasses a number of features that are well-adapted for commercial scale-up. Firstly, the $(TMS)_3P$ addition may be slow and controlled, rather than rapid. As such, a high degree of monodispersity can be maintained. Secondly, the reaction temperature is considerably lower than some of those described in the prior art, making it easier to maintain uniform heating during addition and annealing steps. Additionally, the reaction solution is highly concentrated compared to other described methods, resulting in higher batch yields per unit volume. Therefore, multi-gram scale batches can be obtained using standard lab-bench glassware, with relatively simple modifications to the equipment being required for further scale-up. The simplicity of the reaction procedure means that it can be developed into a semi-automated process.

Although particular embodiments of the present invention have been shown and described, they are not intended to limit what this patent covers. One skilled in the art will understand that various changes and modifications may be made without departing from the scope of the present invention as literally and equivalently covered by the following claims.

What is claimed is:

1. A method of forming a quantum dot (QD), the method comprising:
   reacting a group III precursor with a group V precursor to form a semiconductor core in the presence of a molecular cluster compound, the molecular cluster compound formed in situ by the reaction of a zinc precursor and a chalcogen precursor, wherein
   the zinc precursor is any one of zinc acetate and zinc stearate,
   the chalcogen precursor is any one of 1-dodecanethiol, thiophenol, and 1-octane selenol, and
   the group III precursor, the zinc precursor and the chalcogen precursor are present in a single reaction vessel prior to the in situ formation of the molecular cluster compound, and wherein
   the reacting of the group III precursor with the group V precursor comprises:
      heating a mixture comprising the group III precursor, the group V precursor, the zinc precursor and the chalcogen precursor at a first temperature sufficient to dissolve the group III precursor, the group V precursor, the zinc precursor and the chalcogen precursor, and
      heating the mixture to a second temperature sufficient to initiate growth of the QD.

2. A method as recited in claim 1, wherein the semiconductor core is formed on the molecular cluster compound.

3. A method as recited in claim 1, wherein the first temperature is between 25° C. and 100° C., and the second temperature is between 100° C. and 350° C.

4. A method as recited in claim 3, further comprising maintaining the second temperature for at least 24 hours.

5. A method as recited in claim 1, wherein the zinc precursor and the chalcogen precursor provide a zinc:chalcogen molar ratio between 10:4 and about 10:16.

6. A method as recited in claim 5, wherein the zinc and chalcogen increase the band gap of the QD.

7. A method as recited in claim 1, wherein the group III precursor is indium myristate and the group V precursor is tris(trimethylsilyl)phosphine.

8. A method of forming photo-luminescent InPZnS quantum dot (QD) cores comprising:
  providing a mixture comprising indium myristate, myristic acid, a zinc salt, tris(trimethylsilyl)phosphine and an alkyl or aryl thiol;
  heating the mixture for a period of time at a first temperature, the first temperature sufficient to dissolve indium myristate, myristic acid, the zinc salt, tris(trimethylsilyl)phosphine and the alkyl or aryl thiol;
  adding additional tris(trimethylsilyl)phosphine to the mixture;
  raising the temperature of the mixture to a second, higher temperature, the second temperature sufficient to initiate growth of the QD cores; and
  maintaining the mixture at the second temperature for at least 24 hours, wherein
    the zinc salt is any one of zinc acetate and zinc stearate, and
    the alkyl or aryl thiol is any one of 1-dodecanethiol and thiophenol.

9. A method as recited in claim 8, wherein the molar ratio of zinc salt to alkyl or aryl thiol is between 10:4 and about 10:16.

10. A method as recited in claim 8, wherein the mixture further comprises a pre-formed molecular cluster compound comprising zinc and sulfur.

11. A method as recited in claim 10, wherein the pre-formed molecular cluster compound has the formula $[Zn_{10}S_4(S(C_6H_5))_{16}][NH(C_2H_5)_3]_4$.

12. The method of claim 8, wherein the first temperature is between 25° C. and 100° C. and the second temperature is between 100° C. and 350° C.

13. The method of claim 1, wherein the group III precursor, the group V precursor, the zinc precursor and the chalcogen precursor are present in a single reaction vessel prior to the in situ formation of the molecular cluster compound.

* * * * *